(12) United States Patent
Zhang et al.

(10) Patent No.: US 12,464,891 B2
(45) Date of Patent: Nov. 4, 2025

(54) DISPLAY PANEL AND ON-BOARD DISPLAY APPARATUS

(71) Applicant: BEIJING ZENITHNANO TECHNOLOGY CO., LTD., Beijing (CN)

(72) Inventors: Yuchun Zhang, Beijing (CN); Shudong Zhong, Beijing (CN)

(73) Assignee: BEIJING ZENITHNANO TECHNOLOGY CO., LTD., Beijing (CN)

( * ) Notice: Subject to any disclaimer, the term of this patent is extended or adjusted under 35 U.S.C. 154(b) by 451 days.

(21) Appl. No.: 18/151,830

(22) Filed: Jan. 9, 2023

(65) Prior Publication Data
US 2023/0165043 A1 May 25, 2023

Related U.S. Application Data

(63) Continuation of application No. PCT/CN2021/123152, filed on Oct. 12, 2021.

(30) Foreign Application Priority Data

Sep. 16, 2021 (CN) .......................... 202111096404.1

(51) Int. Cl.
*H10K 50/858* (2023.01)
*B60K 35/22* (2024.01)
(Continued)

(52) U.S. Cl.
CPC ........... *H10K 50/858* (2023.02); *B60K 35/22* (2024.01); *B60K 35/425* (2024.01); *H10K 50/844* (2023.02)

(58) Field of Classification Search
CPC ......... H10K 2102/3026; H10K 50/816; H10K 50/826; H10K 50/828; H10K 50/844;
(Continued)

(56) References Cited

U.S. PATENT DOCUMENTS

| 2008/0023724 A1 | 1/2008 | Takeda et al. |
| 2008/0258609 A1* | 10/2008 | Nakamura ........... H10K 50/852 445/24 |

(Continued)

FOREIGN PATENT DOCUMENTS

| CN | 106684263 A | 5/2017 |
| CN | 111554715 A | 8/2020 |
| CN | 113013203 A | 6/2021 |

OTHER PUBLICATIONS

Journal of the Korean Physical Society, Vo.. 75, No. 2, Jul. 2019, pp. 126-130 (Year: 2019).*

(Continued)

*Primary Examiner* — Shaun M Campbell
(74) *Attorney, Agent, or Firm* — Quarles & Brady LLP

(57) ABSTRACT

The present application discloses a display panel and an onboard display apparatus. The display panel comprises a first electrode layer; an emissive layer group provided on the first electrode layer; a light extraction layer provided on the emissive layer group, the light extraction layer being in a light emission direction of the display panel and serving as a second electrode layer; and an encapsulation layer provided on the light extraction layer; wherein a refractive index of the light extraction layer is smaller than that of the encapsulation layer, so that the anti-reflection of light emitted by the emissive layer group is realized. In the display panel, the light extraction layer and the encapsulation layer form an anti-reflection layer, so that light emitted by the emissive layer group is emitted as much as possible, and the brightness of the display panel is improved.

10 Claims, 4 Drawing Sheets

(51) Int. Cl.
*B60K 35/40*     (2024.01)
*H10K 50/844*    (2023.01)

(58) Field of Classification Search
CPC .... H10K 50/858; H10K 50/86; H10K 59/873;
       H10K 59/879; B60K 35/00; B60K 35/22;
                                     B60K 35/425
See application file for complete search history.

(56) References Cited

U.S. PATENT DOCUMENTS

| | | |
|---|---|---|
| 2017/0012238 A1 | 1/2017 | Lee et al. |
| 2018/0174508 A1 | 6/2018 | Jeong et al. |
| 2019/0058163 A1 | 2/2019 | Wang |
| 2020/0312945 A1* | 10/2020 | Zhu ........................ H10K 71/00 |
| 2022/0223818 A1* | 7/2022 | Ichikawa ............... H05B 33/26 |

OTHER PUBLICATIONS

International Search Report—PCT/CN2021/123152 dated May 27, 2022.

* cited by examiner

US 12,464,891 B2

DISPLAY PANEL AND ON-BOARD DISPLAY APPARATUS

CROSS-REFERENCE TO RELATED APPLICATIONS

This application is the continuation of International Application No. PCT/CN2021/123152, filed Oct. 12, 2021, which claims priority to Chinese Patent Application No. 2021110964041 entitled "DISPLAY PANEL AND ON-BOARD DISPLAY APPARATUS" filed Sep. 16, 2021, the contents of both applications are expressly incorporated herein by reference in its entirety.

TECHNICAL FIELD

The present application relates to the field of display, and in particular to a display panel. The present application further relates to an onboard display apparatus comprising the display panel.

BACKGROUND

OLEDs (organic light emitting diodes) are generally used in flexible display apparatus due to their good display effect and low power consumption. Unlike LED display panels that are illuminated using backlighting, OLED display panels are self-illuminating, which typically comprise a cathode, an electron transport layer, an emissive layer (or an OLED light emitting device), a hole transport layer, an anode, and the like. In order to improve the brightness of the OLED display panel, it is necessary to extract light emitted by the OLED light-emitting device from a layer group of the OLED display panel as much as possible.

SUMMARY

In order to solve the above problem, a first aspect of the present invention provides a display panel. The display panel comprises a first electrode layer; an emissive layer group provided on the first electrode layer; a light extraction layer provided on the emissive layer group, the light extraction layer being in a light emission direction of the display panel and serving as a second electrode layer; and an encapsulation layer provided on the light extraction layer. A refractive index of the light extraction layer is smaller than that of the encapsulation layer so that the anti-reflection of light emitted by the emissive layer group is realized.

In one embodiment, the light extraction layer has a refractive index of between 1.15 and 1.35, the encapsulation layer has a refractive index of between 1.4 and 1.8, the light extraction layer has a thickness of between 50 nm and 200 nm, and the encapsulation layer has a thickness of between 23 µm and 1 mm.

In one embodiment, the light extraction layer comprises: a first conductive layer in contact with the emissive layer group, a first protective layer in contact with the first conductive layer, a second conductive layer in contact with the first protective layer, a second protective layer in contact with the second conductive layer, and a light-exiting layer in contact with the second protective layer; wherein the first conductive layer has a first refractive index $n1$ and a first thickness $d1$, the first protective layer has a second refractive index $n2$ and a second thickness $d2$, the second conductive layer has a third refractive index $n3$ and a third thickness $d3$, the second protective layer has a fourth refractive index $n4$ and a fourth thickness $d4$, and the light-exiting layer has a fifth refractive index $n5$ and a fifth thickness $d5$; wherein $n1$ is between 1.8 and 2.1, and $d1$ is between 20 nm and 80 nm; $n2$ is between 0.1 and 5, and $d2$ is between 0.5 nm and 10 nm; $n3$ is between 0.1 and 1.5, and $d3$ is between 5 nm and 50 nm; $n4$ is between 1.3 and 2.1, and $d4$ is between 0.5 nm and 10 nm; $n5$ is between 1.8 and 2.4, and $d5$ is between 20 nm and 80 nm.

In one embodiment, the first conductive layer comprises a conductive metal oxide; the first protective layer comprises one of a metal, a conductive metal oxide, and a conductive metal nitride; the second conductive layer comprises a conductive material, and a metal oxide and/or a metal nitride; the second protective layer comprises one of a non-metal oxide, a metal nitride, and a metal oxide; a main body of the light-exiting layer comprises one of a non-metal oxide, a non-metal nitride, a non-metal sulfide, a non-metal fluoride, and a non-metal carbide.

In one embodiment, a material of the first conductive layer is selected from one of $In_2O_3$, $SnO_2$, ZnO, ITO, TZO, AZO, ITiO, IZTO, and FTO; a material of the first protective layer is selected from one of Ti, Ni, Cr, Al, NiCr, TiN, ZnO, $TiO_2$, $SnO_2$, $SiO_2$, $Nb_2O_5$, $Ta_2O_5$, and $Si_3N_4$; a conductive material of the second conductive layer is selected from one of Ag, Cu, Al, Mo, an Ag alloy, a Cu alloy, an Al alloy, and an Mo alloy, and the second conductive layer further comprises an inclusion formed by an oxide and/or a nitride of the conductive material of the second conductive layer; a material of the second protective layer is selected from one of TiN, ZnO, $TiO_2$, $SnO_2$, $SiO_2$, $Si_3N_4$, AZO, IZO, and YZO; a material of the main body of the light-exiting layer is selected from one of $TiO_2$, $SnO_2$, ZnO, $Nb_2O_5$, $Ta_2O_5$, $Si_3N_4$, ZnS, $SiO_2$, $Al_2O_3$, MgF, MgS, SiC, AZO, GZO, TiN, and YZO.

In one embodiment, the first electrode layer is a cathode having a light reflection function, the second electrode layer is an anode, and the emissive layer group comprises an electron transport layer in contact with the cathode, a hole transport layer in contact with the anode, and an excitation layer between the electron transport layer and the hole transport layer; a part of light emitted by the emissive layer group is emitted through the light extraction layer and the encapsulation layer, and the other part of light is reflected by the first electrode layer and then emitted through the emissive layer group, the light extraction layer, and the encapsulation layer.

In one embodiment, the reflective layer comprises a metal layer in contact with the emissive layer group, and a metal alloy layer in contact with the metal layer.

In one embodiment, a material of the metal layer is one of Ag, Al, Mo, Cu, and In; the metal alloy layer is an alloy of the material of the metal layer.

In one embodiment, the first electrode layer is an anode, the second electrode layer is a cathode, and the emissive layer group comprises an electron transport layer in contact with the cathode, a hole transport layer in contact with the anode, and an excitation layer between the electron transport layer and the hole transport layer.

In one embodiment, the electron transport layer is TPBi with a thickness of 75 nm; the excitation layer is Ir(ppy)2acac doped CBP with a thickness of 20 nm; the hole transport layer is TAPC with a thickness of 40 nm.

An onboard display apparatus according to a second aspect of the present application comprises the display panel according to the above description.

Compared with the prior art, the present application has the beneficial effects as follows: in the display panel, the light extraction layer and the encapsulation layer form an anti-reflection layer, so that light emitted by the emissive layer group is emitted as much as possible, and the brightness of the display panel is improved.

BRIEF DESCRIPTION OF THE DRAWING

The drawings described herein are used for providing a further understanding of the present application and constitute a part of the present application. The illustrative embodiments of the present application and the descriptions thereof are used for explaining the present application and do not constitute an undue limitation to the present application. In the drawings.

DETAILED DESCRIPTION

In order to make the objects, technical solutions, and advantages of the present application clear, the technical solutions of the present application will be clearly and completely described below with reference to specific embodiments and corresponding accompanying drawings of the present application. The described embodiments are merely a part, rather than all of the embodiments of the present application. Based on the embodiments in the present application, all other embodiments obtained by those of the ordinary skilled in the art without creative work shall fall within the protection scope of the present application.

Figure 1:
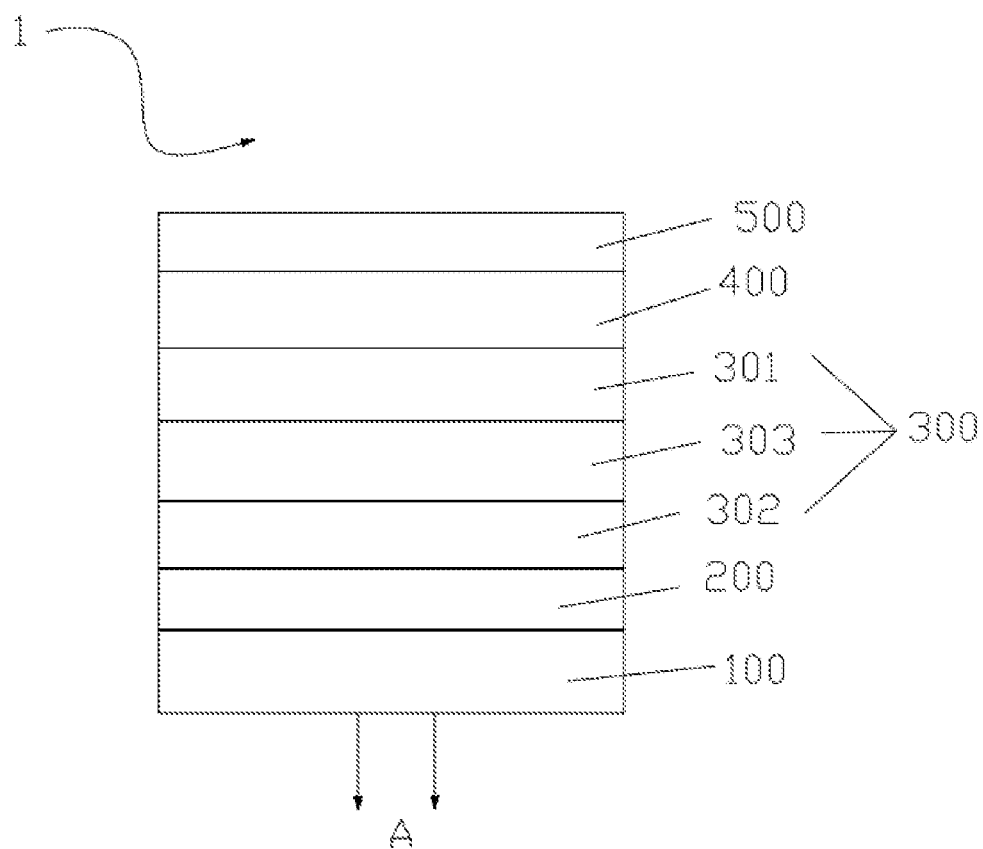
FIG. 1 schematically shows a display panel according to an embodiment of the present application.
Figure 5:
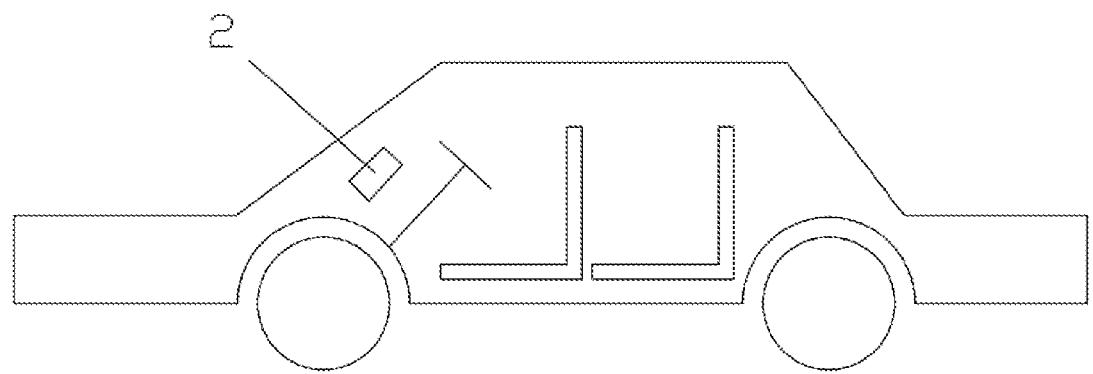
FIG. 5 schematically shows an onboard display apparatus according to the present application.
Figure 6:
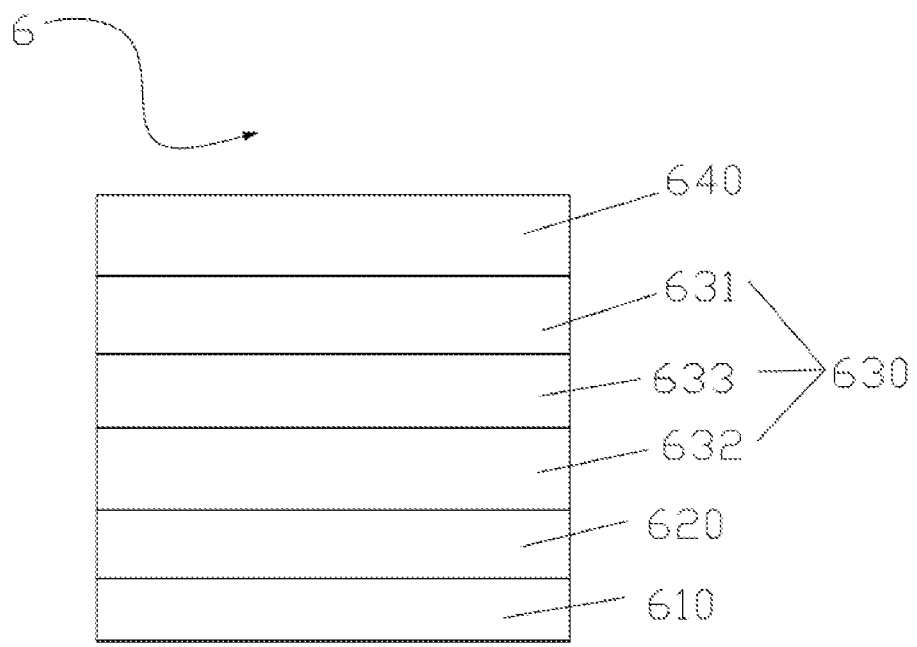
FIG. 6 schematically shows the structure of a comparative example of a display panel.

FIG. 1 is a schematic diagram of a display panel 1 according to an embodiment of the present application. A self-luminous organic light emitting material (e.g., OLED) is applied to the display panel 1 as a light source, and the display panel 1 is suitable for an onboard display apparatus such as an instrument panel of an automobile. FIG. 5 schematically shows an onboard display apparatus 2 using display panel 1.

Display panel 1 may be of a top emission type (that is, light is emitted through a cathode) or a bottom emission type (that is, light is emitted through an anode).

The following describes in detail the bottom emission type of display panel 1.

As shown in FIG. 1, the display panel 1 comprises a first electrode layer 400; an emissive layer group 300 provided on the first electrode layer 400; a light extraction layer 200 provided on the emissive layer group 300; and an encapsulation layer 100 provided on the light extraction layer 200. The light extraction layer 200 is in a light emission direction of display panel 1 (arrow A shown in FIG. 1) and serves as a second electrode layer. The refractive index of the light extraction layer 200 is smaller than that of the encapsulation layer 100, so the anti-reflection of light emitted by the emissive layer group 300 is realized.

In this way, when the light extraction layer 200 and the first electrode layer 400 are powered on, the emissive layer group 300 of the display panel 1 emits light by a flowing current. The refractive index of the light extraction layer 200 is lower than that of the encapsulation layer 100, so both the light extraction layer 200 and the encapsulation layer 100 form an anti-reflection layer, which further contributes to the light emitted by the emissive layer group 300 being emitted as much as possible, thereby further improving the brightness (or quantum luminous efficiency) of the display panel 1.

Figure 2:
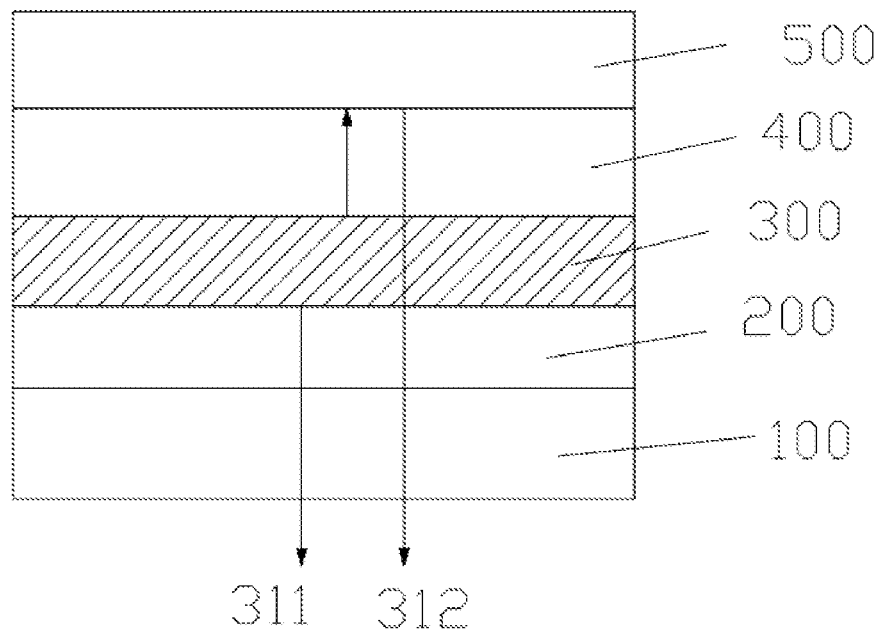
FIG. 2 schematically shows a light path of the display panel shown in FIG. 1.
Figure 3:
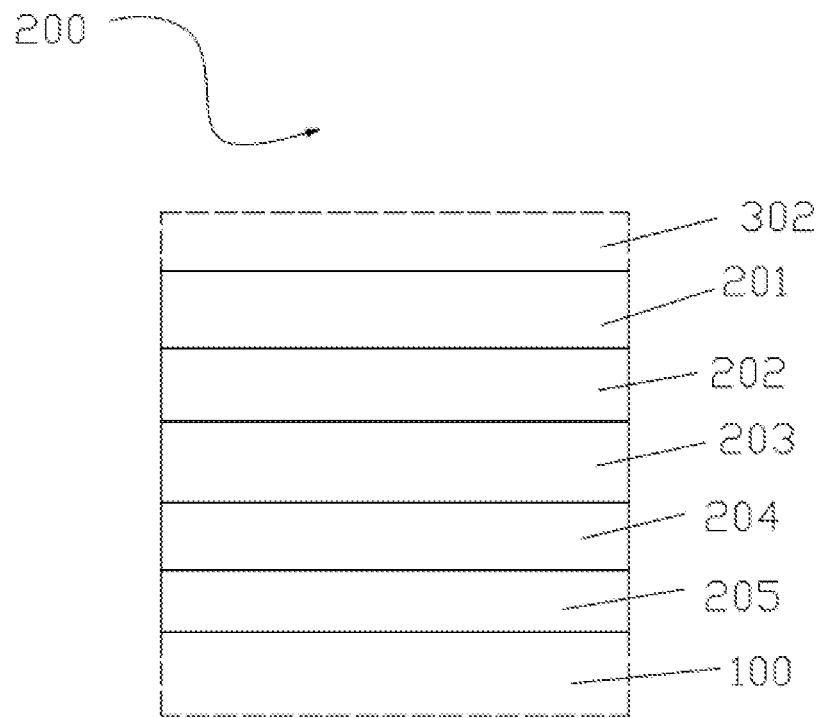
FIG. 3 schematically shows the structure of a light extraction layer.

In one embodiment, the first electrode layer 400 is a cathode having light reflection performance. The light extraction layer 200 is an anode. As shown in FIG. 2, a part of the light 311 emitted by the emissive layer group 300 is emitted through the light extraction layer 200 and the encapsulation layer 100, and the other part of the light 312 is reflected by the first electrode layer 400 and then emitted from the display panel 1 through the emissive layer group 300, the light extraction layer 200, and the encapsulation layer 100, which contributes to the light emitted by the emissive layer group 300 being emitted as much as possible, thereby further improving the brightness of the display panel 1.

In one embodiment, the light extraction layer 200 has a refractive index of between 1.15 and 1.35, and the encapsulation layer 100 has a refractive index of between 1.4 and 1.8; accordingly, the light extraction layer 200 has a thickness of between 50 nm and 200 nm, and the encapsulation layer 100 has a thickness of between 23 μm and 1 mm. The inventors have found that setting parameters of the light extraction layer 200 and the encapsulation layer 100 within this range can ensure that the light emitted by the emissive layer group 300 is emitted more effectively, and even the quantum luminous efficiency of the display panel 1 reaches 70% or more, which is much higher than that of the OLED display panel in the prior art.

In one embodiment, the light extraction layer 200 further comprises a first conductive layer 201 in contact with the emissive layer group 300, a first protective layer 202 in contact with the first conductive layer 201, a second conductive layer 203 in contact with the first protective layer 202, a second protective layer 204 in contact with the second conductive layer 203, and a light-exiting layer 205 in contact with the second protective layer 204. That is, the first conductive layer 201, the first protective layer 202, the second conductive layer 203, the second protective layer 204, and the light-exiting layer 205 are provided in a stacked manner, the first conductive layer 201 is in electrical contact with the emissive layer group 300, and the light-exiting layer 205 is in contact with the encapsulation layer 100.

The first conductive layer 201 has a first refractive index n1 and a first thickness d1, the first protective layer 202 has a second refractive index n2 and a second thickness d2, the second conductive layer 203 has a third refractive index n3 and a third thickness d3, the second protective layer 204 has a fourth refractive index n4 and a fourth thickness d4, and the light-exiting layer 205 has a fifth refractive index n5 and a fifth thickness d5. n1 is between 1.8 and 2.1, and d1 is between 20 nm and 80 nm; n2 is between 0.1 and 5, and d2 is between 0.5 nm and 10 nm; n3 is between 0.1 and 1.5, and d3 is between 5 nm and 50 nm; n4 is between 1.3 and 2.1, and d4 is between 0.5 nm and 10 nm; n5 is between 1.8 and 2.4, and d5 is between 20 nm and 80 nm. The inventors have found that, by constructing the light extraction layer 200 as these sub-layers, the refractive index of the light extraction layer 200 may be conveniently adjusted between 1.2 and 1.25, and at the same time, the thickness of the light extraction layer 200 is kept between 90 nm and 110 nm. In this way, the light extraction layer 200 can be fitted to more types of encapsulation layers 100, and at the same time, the higher quantum luminous efficiency of the display panel 1 is kept.

It should be understood that the number of the sub-layers of the light extraction layer 200 may be more or less (even, may be one layer), as long as the thickness and the refractive index thereof can satisfy the requirement, and are not described herein again.

The first conductive layer 201 comprises a conductive metal oxide, for example, the material of the first conductive layer 201 is selected from one of $In_2O_3$, $SnO_2$, ZnO, ITO, TZO, AZO, ITiO, IZTO, and FTO. In ITO, the doping weight percentage of $Sn_2O$ is greater than 0 and less than or equal to 50%; in IZO, the doping weight percentage of ZnO is greater than 0 and less than or equal to 50%; in AZO, the doping weight percentage of $Al_2O_3$ is greater than 0 and less than or equal to 50%; in the ITiO, the doping weight percentage of $TiO_2$ is greater than 0 and less than or equal to 10%; in IZTO, the doping weight percentage of $TiO_2$ is greater than 0 and less than or equal to 10%, and the doping weight percentage of ZnO is greater than 0 and less than or equal to 40%; in FTO, the doping weight percentage of F is greater than 0 and less than or equal to 10%. The inventors have found that the use of the above materials not only achieves the required refractive index, but also has good electrical conductivity, reduces resistance, and contributes to the emissive layer group 300 having an excellent light-emitting effect.

The first protective layer 202 comprises one of a metal, a conductive metal oxide, and a conductive metal nitride. For example, the metal may be one of Ti, Ni, Cr, Al and NiCr; the metal oxide may be one of ZnO, $TiO_2$, $SnO_2$, $SiO_2$, $Nb_2O_5$, and $Ta_2O_5$; the metal nitride may be one of TiN and $Si_3N_4$. The inventors have found that the materials selected for the first protective layer 202 not only achieve the required refractive index but also have good anti-oxidation performance, which can prevent oxygen molecules from penetrating the second conductive layer 203, thereby ensuring that the second conductive layer 203 has good electrical conductivity. In addition, since the first protective layer 202 has a small thickness, the metal oxide or the metal nitride also has good electrical conductivity due to the quantum tunneling effect, which enables the light extraction layer 200 to serve as an electrode.

The second conductive layer 203 comprises a conductive material and inevitable metal oxide and/or metal nitride inclusions. For example, the conductive material is selected from one of Ag, Cu, Al, Mo, an Ag alloy, a Cu alloy, an Al alloy, and an Mo alloy. In a specific embodiment, in the Ag alloy layer, the weight ratio of Ag is greater than 50%, and the rest 50% may be one of metal elements such as Zn, Cu, In, Pt, Pd, Au, Nb, Nd, B, Bi, and Ni; in the Cu alloy, the weight ratio of Cu is greater than 50%, and the rest 50% may be one of metal elements such as Zn, Ag, In, Pt, Pd, Au, Nb, Nd, B, Bi, and Ni; in the Mo alloy layer, the weight ratio of Mo is greater than 80%, and the rest 20% may be one of metal elements such as Zn, Cu, In, Pt, Pd, Au, Nb, Nd, B, Bi, and Ni; in the Al alloy layer, the weight ratio of Al is greater than 80%, and the rest 20% may be one of metal elements such as Zn, Cu, In, Pt, Pd, Au, Nb, Nd, B, Bi, and Ni. The metal oxide and/or metal nitride inclusion is formed by oxidizing and nitriding the metal or alloy by introducing a small amount of oxygen and nitrogen in the process of coating the metal target. These metals or alloys have good conductivity, and even if they contain a small amount of metal oxide and/or nitride inclusions, the electrical conductivity of the second conductive layer 203 will not be weakened as a whole. In addition, these metal oxides and metal nitrides also improve the light transmittance of the second conductive layer 203, which contributes to the improvement of the brightness of the display panel 1.

The second protective layer 204 comprises a non-metal oxide, a metal nitride, and a metal oxide. For example, the non-metal oxide, the metal nitride, and the metal oxide may be TiN, ZnO, $TiO_2$, $SnO_2$, $SiO_2$, and $Si_3N_4$. The second protective layer 204 formed by these compounds has good weather resistance and water resistance, and the protective effect on the second conductive layer 203 is improved. Since the second protective layer 204 has a small thickness, the non-metal oxide, the metal nitride, and the metal oxide also have good electrical conductivity due to the quantum tunneling effect, which enables the second protective layer 204 has good electrical conductivity, and the light extraction layer 200 can also serve as an electrode.

The light-exiting layer 205 comprises a non-metal oxide, a non-metal nitride, a non-metal sulfide, a non-metal fluoride, and a non-metal carbide. For example, the material of the light-exiting layer 205 is selected from one of $TiO_2$, $SnO_2$, ZnO, $Nb_2O_5$, $Ta_2O_5$, $Si_3N_4$, ZnS, $SiO_2$, $Al_2O_3$, MgF, MgS, SiC, AZO, GZO, TiN, and YZO. These materials have a higher refractive index, which contributes to meeting the refractive index requirements of the light extraction layer 200. In addition, due to the quantum tunneling effect, these compounds also have appropriate electrical conductivity, which can reduce the resistance of the light-exiting layer 205 (and the light extraction layer 200), thereby contributing to the good light-emitting effect of the emissive layer group 300.

Figure 4:
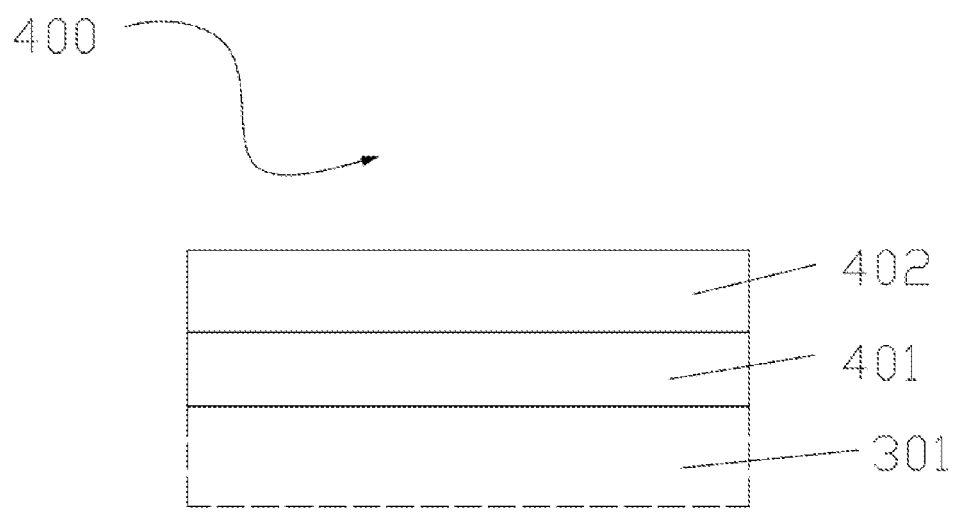
FIG. 4 schematically shows the structure of a reflective layer.

As also shown in FIG. 4, the first electrode layer 400 of the display panel 1 comprises a metal layer 401 and a metal alloy layer 402 in contact with the metal layer 401. The metal layer 401 is in electrical contact with the emissive layer group 300. Thus, the entire first electrode layer 400 has good electrical conductivity and is suitable for use as an electrode.

In one embodiment, the metal layer 401 of the first electrode layer 400 is one of Ag, Al, Mo, Cu, and In. The metal alloy layer 402 is one of an Ag alloy, an Al alloy, and an Mo alloy; the thickness thereof may be 5 nm to 300 nm. In the Ag alloy, the weight ratio of Ag is greater than 50%, and the rest may be doped by one of Ti, Li, Yb, Ir, Mg, Zn, Cu, Al, In, Pt, Pd, Au, Nb, Nd, B, Bi, and Ni. In the Mo alloy, the weight ratio of Mo is greater than 80%, and the rest may be one of Ti, Li, Yb, Ir, Mg, Zn, Cu, Al, In, Pt, Pd, Au, Nb, Nd, B, Bi, and Ni. In the Al alloy, the weight ratio of Al is greater than 80%, and the rest may be one of Ti, Li, Yb, Ir, Mg, Zn, Cu, Al, In, Pt, Pd, Au, Nb, Nd, B, Bi, and Ni. The thickness of the metal alloy layer 402 may be 5 nm to 300 nm. The inventors have found that the surface of the metal or the alloy can be made very smooth by manufacturing the metal or the alloy into a film with a thickness of 5 nm to 300 nm, so that the light reflection performance of the first electrode layer is greatly improved, and the brightness of the display panel 1 is further improved. In addition, the metal alloy layer 402 has good oxidation resistance, which contributes to protecting the layers on its inner side from oxidation. In addition, the cost of the metal alloy layer 402 is lower than that of the metal layer 401, which contributes to reducing the cost of the display panel 1.

As also shown in FIG. 1, the first electrode layer 400 is a cathode, the second electrode layer 200 is an anode, and the emissive layer group 300 comprises an electron transport layer 301 in contact with the cathode 400, a hole transport layer 302 in contact with the anode 200, and an excitation layer 303 between the electron transport layer 301 and the hole transport layer 302. In a specific embodiment, the material of the electron transport layer 301 is TPBi with a thickness of 75 nm; the hole transport layer 302 is TAPC with a thickness of 40 nm; the excitation layer 303 is Ir(ppy)2acac doped CBP with a thickness of 20 nm. The inventors have found that, with the above materials, the interface resistance between the electron transport layer 301 and the first electrode layer 400 is small, the interface resistance between the hole transport layer 302 and the first conductive layer 201 is small, and the interface resistances between the excitation layer 303, and the electron transport layer 301 and the hole transport layer 302 are also small, which contributes to the improvement in current efficiency, thereby further improving the brightness of the display panel 1.

It should be understood that a substrate 500 is also provided on outer side of the first electrode layer 400. The substrate 500 protects other layers of the display panel 1, and the material thereof may be the same as that of the encapsulation layer 100 and is not described herein again.

Figure 7:
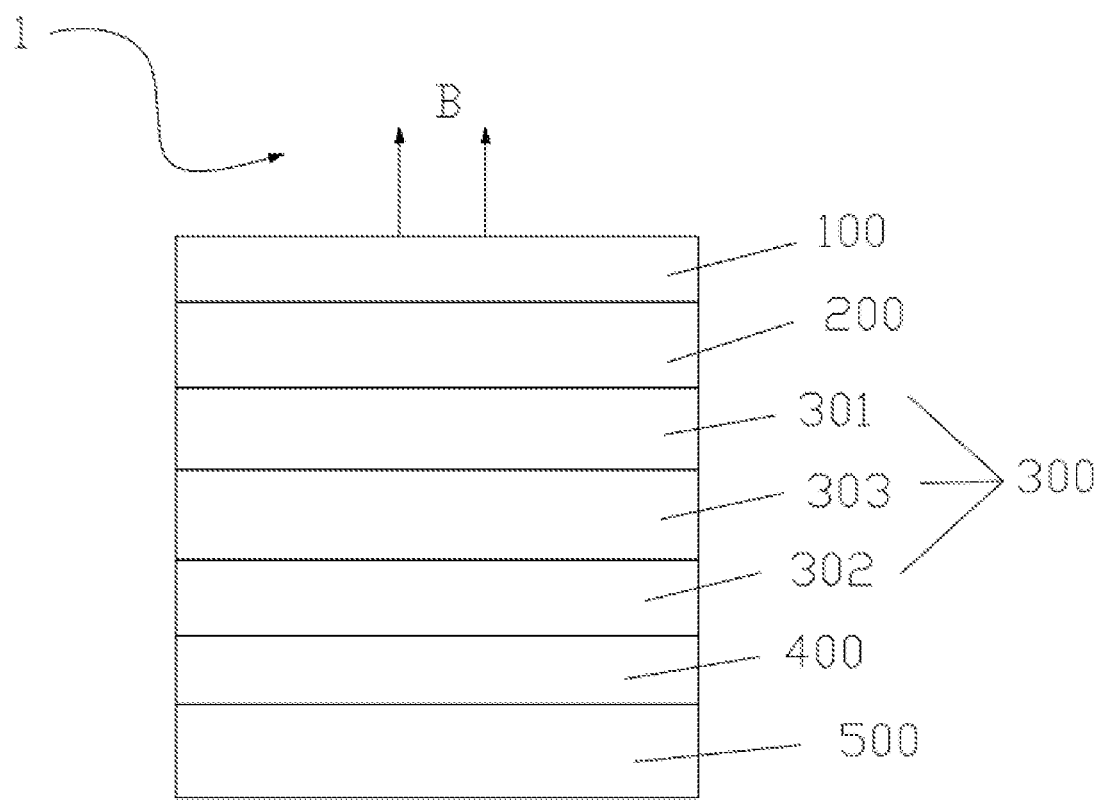
FIG. 7 schematically shows a display panel according to another embodiment of the present application.

FIG. 7 schematically shows a display panel 1 with a top emission structure. As shown in FIG. 7, the display panel 1 comprises a substrate 500, an anode 400 formed on the substrate 500; an emissive layer group 300 provided on the anode 400; a light extraction layer 200 provided on the emissive layer group 300; and an encapsulation layer 100 provided on the light extraction layer 200. The light extraction layer 200 is in a light emission direction of display panel 1 (arrow B shown in FIG. 7) and serves as a cathode. The light extraction layer 200 is the same as the light extraction layer of the bottom emission display panel described above and has a refractive index smaller than that of the encapsulation layer 100, so that the anti-reflection of light emitted by the emissive layer group 300 is realized, and the brightness of the display panel 1 is improved.

Example 1

In the bottom emission display panel 1, encapsulation layer 100 is CPI with a thickness of 23 μm and a refractive index of 1.65.

In the light extraction layer 200, the first conductive layer 201 is AZO with a thickness of 40 nm and a refractive index of 2.0; the first protective layer 202 is $SnO_2$ with a thickness of 2 nm and a refractive index of 1.9; the second conductive layer 203 is a mixture of Ag and AgO with a thickness of 12 nm and a refractive index of 0.4; the second protective layer 204 is $SnO_2$ with a thickness of 2 nm and a refractive index of 1.9; the light-exiting layer 205 is AZO with a thickness of 40 nm and a refractive index of 2.0.

In the emissive layer group 300, the material of the electron transport layer 301 is TPBi with a thickness of 75 nm; the hole transport layer 302 is TAPC with a thickness of 40 nm; the excitation layer 303 is Ir(ppy)2acac doped CBP with a thickness of 20 nm.

In the first electrode layer 400, the metal layer 401 is Ag; the metal alloy layer 402 is an AgMg alloy.

The optical parameters of Example 1 are shown in Table 1.

Example 2

In the bottom emission display panel 1, encapsulation layer 100 is COP with a thickness of 50 μm and a refractive index of 1.62.

In the light extraction layer 200, the first conductive layer 201 is IZTO with a thickness of 45 nm and a refractive index of 2.0; the first protective layer 202 is Cr with a thickness of 1 nm and a refractive index of 2.7; the second conductive layer 203 is a mixture of AgTi and AgTiN with a thickness of 15 nm and a refractive index of 0.5; the second protective layer 204 is ZnO with a thickness of 5 nm and a refractive index of 1.9; the light-exiting layer 205 is $SnO_2$ with a thickness of 50 nm and a refractive index of 1.9.

In the emissive layer group 300, the material of the electron transport layer 301 is TPBi with a thickness of 75 nm; the hole transport layer 302 is TAPC with a thickness of 40 nm; the excitation layer 303 is Ir(ppy)2acac doped CBP with a thickness of 20 nm.

In the first electrode layer 400, the metal layer 401 is Ag; the metal alloy layer 402 is an AgTi alloy.

The optical parameters of Example 2 are shown in Table 1.

Example 3

In the bottom emission display panel 1, the encapsulation layer 100 is PET with a thickness of 100 μm and a refractive index of 1.55.

In the light extraction layer 200, the first conductive layer 201 is FTO with a thickness of 40 nm and a refractive index of 2.0; the first protective layer 202 is Ti with a thickness of 2 nm and a refractive index of 1.9; the second conductive layer 203 is a mixture of Al and $AlO_x$ with a thickness of 35 nm and a refractive index of 0.9; the second protective layer 204 is $SnO_2$ with a thickness of 10 nm and a refractive index of 1.9; the light-exiting layer 205 is $Nb_2O_5$ with a thickness of 48 nm and a refractive index of 2.4.

In the emissive layer group 300, the material of the electron transport layer 301 is TPBi with a thickness of 75 nm; the hole transport layer 302 is TAPC with a thickness of 40 nm; the excitation layer 303 is Ir(ppy)2acac doped CBP with a thickness of 20 nm.

In the first electrode layer 400, the metal layer 401 is Ag; the metal alloy layer 402 is an AgIn alloy.

The optical parameters of Example 3 are shown in Table 1.

Example 4

In the bottom emission display panel 1, encapsulation layer 100 is PC with a thickness of 75 μm and a refractive index of 1.58.

In the light extraction layer 200, the first conductive layer 201 is TZO with a thickness of 55 nm and a refractive index of 1.85; the first protective layer 202 is Al with a thickness of 0.5 nm and a refractive index of 0.9; the second conductive layer 203 is a mixture of Cu and $CuN_x$ with a thickness of 18 nm and a refractive index of 0.5; the second protective layer 204 is ZnO with a thickness of 10 nm and a refractive index of 2.0; the light-exiting layer 205 is $TiO_2$ with a thickness of 30 nm and a refractive index of 2.2.

In the emissive layer group 300, the material of the electron transport layer 301 is TPBi with a thickness of 75 nm; the hole transport layer 302 is TAPC with a thickness of 40 nm; the excitation layer 303 is Ir(ppy)2acac doped CBP with a thickness of 20 nm.

In the first electrode layer 400, the metal layer 401 is Ag; the metal alloy layer 402 is an AgPdPt alloy.

The optical parameters of Example 4 are shown in Table 1.

Example 5

In the bottom emission display panel 1, encapsulation layer 100 is glass with a thickness of 0.5 mm and a refractive index of 1.52.

In the light extraction layer 200, the first conductive layer 201 is ITO with a thickness of 55 nm and a refractive index of 2.0; the first protective layer 202 is $Si_3N_4$ with a thickness of 2 nm and a refractive index of 2.1; the second conductive layer 203 is a mixture of AgZn and $AgZnO_x$ with a thickness of 13 nm and a refractive index of 0.4; the second protective layer 204 is ZnO with a thickness of 8 nm and a refractive index of 2.0; the light-exiting layer 205 is $Ta_2O_5$ with a thickness of 35 nm and a refractive index of 2.2.

In the emissive layer group 300, the material of the electron transport layer 301 is TPBi with a thickness of 75 nm; the hole transport layer 302 is TAPC with a thickness of 40 nm; the excitation layer 303 is Ir(ppy)2acac doped CBP with a thickness of 20 nm.

In the first electrode layer 400, the metal layer 401 is Ag; the metal alloy layer 402 is an AgYb alloy.

The optical parameters of Example 5 are shown in Table 1.

Example 6

In the top emission display panel 1, encapsulation layer 100 is glass with a thickness of 0.33 mm and a refractive index of 1.52.

In the light extraction layer 200, the first conductive layer 201 is AZO with a thickness of 42 nm and a refractive index of 2.0; the first protective layer 202 is $Si_3N_4$ with a thickness of 2 nm and a refractive index of 2.1; the second conductive layer 203 is a mixture of AgIn and $AgInO_x$ with a thickness of 15 nm and a refractive index of 0.4; the second protective layer 204 is ZnO with a thickness of 5 nm and a refractive index of 2.0; the light-exiting layer 205 is TiN with a thickness of 47 nm and a refractive index of 1.9.

In the emissive layer group 300, the material of the electron transport layer 301 is TPBi with a thickness of 75 nm; the hole transport layer 302 is TAPC with a thickness of 40 nm; the excitation layer 303 is Ir(ppy)2acac doped CBP with a thickness of 20 nm.

The optical parameters of Example 6 are shown in Table 1.

Comparative Example

The comparative example is a bottom emission display panel 6 manufactured using the prior art. In display panel 6, encapsulation layer 610 is PET with a thickness of 50 μm and a refractive index of 1.55.

In an anode layer 620, the material is ITO with a thickness of 150 nm and a refractive index of 2.0.

In the emissive layer group 630, the material of the electron transport layer 631 is TPBi with a thickness of 75 nm; the hole transport layer 632 is TAPC with a thickness of 40 nm; the excitation layer 633 is Ir(ppy)2acac doped CBP with a thickness of 20 nm.

In a cathode layer 640, the metal alloy is AgMg.

The optical parameters of the comparative examples are shown in Table 1.

TABLE 1

| Serial number | Refractive index, thickness (nm) of the light extraction layer/the anode layer | Refractive index of the encapsulation layer Thickness (nm) | Quantum luminous efficiency |
|---|---|---|---|
| Example 1 | 1.27 | 1.65 | 74.2% |
| Example 2 | 1.22 | 1.62 | 75.2% |
| Example 3 | 1.32 | 1.55 | 71.7% |
| Example 4 | 1.25 | 1.58 | 72.1% |
| Example 5 | 1.21 | 1.52 | 75.8% |
| Example 6 | 1.20 | 1.52 | 76% |
| Comparative Example | 2.1 | 1.55 | 60.4% |

As shown in Table 1, the quantum luminous efficiencies of the display panels according to Examples 1-6 of the present application are high, all of which are 70% or more, whereas the quantum luminous efficiencies of the display panels in the prior art are about 60%, which indicates that the brightness of the display panel according to the present application is higher.

The above description is only an example of the present application and is not intended to limit the present application. For those skilled in the art, various modifications and changes may occur in the present application. Any modification, equivalent, improvement, and the like made without departing from the spirit and principle of the present application shall fall within the scope of the claims of the present application.

What is claimed is:

1. A display panel, comprising:
   a first electrode layer;
   an emissive layer group provided on the first electrode layer;
   a light extraction layer provided on the emissive layer group, the light extraction layer being in a light emission direction of the display panel and serving as a second electrode layer; and
   an encapsulation layer provided on the light extraction layer;
   wherein a refractive index of the light extraction layer is smaller than that of the encapsulation layer;
   wherein the light extraction layer comprises:
      a first conductive layer in contact with the emissive layer group;
      a first protective layer in contact with the first conductive layer;
      a second conductive layer in contact with the first protective layer;
      a second protective layer in contact with the second conductive layer; and
      a light-exiting layer in contact with the second protective layer;
   wherein the first conductive layer has a first refractive index n1 and a first thickness d1, the first protective layer has a second refractive index n2 and a second thickness d2, the second conductive layer has a third refractive index n3 and a third thickness d3, the second protective layer has a fourth refractive index n4 and a fourth thickness d4, and the light-exiting layer has a fifth refractive index n5 and a fifth thickness d5; and
   wherein n1 is between 1.8 and 2.1, and d1 is between 20 nm and 80 nm; n2 is between 0.1 and 5, and d2 is between 0.5 nm and 10 nm; n3 is between 0.1 and 1.5, and d3 is between 5 nm and 50 nm; n4 is between 1.3 and 2.1, and d4 is between 0.5 nm and 10 nm; n5 is between 1.8 and 2.4, and d5 is between 20 nm and 80 nm.

2. The display panel according to claim 1, wherein:
the light extraction layer has a refractive index of between 1.15 and 1.35, the encapsulation layer has a refractive index of between 1.4 and 1.8; and
the light extraction layer has a thickness of between 50 nm and 200 nm, and the encapsulation layer has a thickness of between 23 μm and 1 mm.

3. The display panel according to claim 1, wherein:
the first conductive layer comprises a conductive metal oxide;
the first protective layer comprises one of a metal, a conductive metal oxide, and a conductive metal nitride;
the second conductive layer comprises a conductive material, and a metal oxide and/or a metal nitride;
the second protective layer comprises one of a non-metal oxide, a metal nitride, and a metal oxide;
the light-exiting layer comprises one of a non-metal oxide, a non-metal nitride, a non-metal sulfide, a non-metal fluoride, and a non-metal carbide.

4. The display panel according to claim 3, wherein:
a material of the first conductive layer is selected from one of $In_2O_3$, $SnO_2$, ZnO, ITO, TZO, AZO, ITIO, IZTO, and FTO;
a material of the first protective layer is selected from one of Ti, Ni, Cr, Al, NiCr, TiN, ZnO, $TiO_2$, $SnO_2$, $SiO_2$, $Nb_2O_5$, $Ta_2O_5$, and $Si_3N_4$;
a conductive material of the second conductive layer is selected from one of Ag, Cu, Al, Mo, an Ag alloy, a Cu alloy, an Al alloy, and an Mo alloy, and the second conductive layer further comprises an inclusion formed by an oxide and/or a nitride of the conductive material of the second conductive layer;
a material of the second protective layer is selected from one of TiN, ZnO, $TiO_2$, $SnO_2$, $SiO_2$, $Si_3N_4$, AZO, IZO, and YZO; and
a material of the light-exiting layer is selected from one of $TiO_2$, $SnO_2$, ZnO, $Nb_2O_5$, $Ta_2O_5$, $Si_3N_4$, ZnS, $SiO_2$, $Al_2O_3$, MgF, MgS, SiC, AZO, GZO, TiN, and YZO.

5. The display panel according to claim 4, wherein:
the first electrode layer is a cathode having a light reflection function, the second electrode layer is an anode, the emissive layer group comprises an electron transport layer in contact with the cathode, a hole transport layer in contact with the anode, and an excitation layer between the electron transport layer and the hole transport layer;
a part of the light emitted by the emissive layer group is emitted through the light extraction layer and the encapsulation layer, and the other part of the light is reflected by the first electrode layer and then emitted through the emissive layer group, the light extraction layer, and the encapsulation layer.

6. The display panel according to claim 5, wherein the first electrode layer comprises a metal layer in contact with the emissive layer group, and a metal alloy layer in contact with the metal layer.

7. The display panel according to claim 6, wherein a material of the metal layer is one of Ag, Al, Mo, Cu, and In;
the metal alloy layer is an alloy of the material of the metal layer.

8. The display panel according to claim 4, wherein the first electrode layer is an anode, the second electrode layer is a cathode, and the emissive layer group comprises an electron transport layer in contact with the cathode, a hole transport layer in contact with the anode, and an excitation layer between the electron transport layer and the hole transport layer.

9. The display panel according to claim 5, wherein the electron transport layer is TPBi with a thickness of 75 nm;
the excitation layer is Ir(ppy)2acac doped CBP with a thickness of 20 nm;
the hole transport layer is TAPC with a thickness of 40 nm.

10. An onboard display apparatus, comprising the display panel according to claim 1.

* * * * *